MODULAR ELECTRONIC CIRCUIT ASSEMBLY WITH IMPROVED SUBCOMPONENT PACKAGING ASSEMBLIES

Original Filed Oct. 25, 1965 3 Sheets-Sheet 1

INVENTORS
Pier Giorgio Perotto
Edoardo Ecclesia
BY
Shoemaker and Mattare
ATTYS.

INVENTORS
PIER GIORGIO PEROTTO
EDOARDO ECCLESIA
BY
Shoemaker and Mattare
ATTYS.

INVENTORS
PIER GIORGIO PEROTTO
EDOARDO ECCLESIA
BY
Shoemaker and Mattare
ATTYS.

United States Patent Office 3,478,251
Patented Nov. 11, 1969

3,478,251
MODULAR ELECTRONIC CIRCUIT ASSEMBLY WITH IMPROVED SUBCOMPONENT PACKAGING ASSEMBLIES

Pier Giorgio Perotto, Turin, and Edoardo Ecclesia, Ivrea, Italy, assignors to Ing. C. Olivetti & C., S.p.A., Ivrea, Italy, a corporation of Italy Continuation of application Ser. No. 505,147, Oct. 25, 1965. This application Oct. 23, 1968, Ser. No. 770,896
Claims priority, application Italy, Oct. 30, 1964, 23,675/64
Int. Cl. H02b *1/04*
U.S. Cl. 317—101 2 Claims

ABSTRACT OF THE DISCLOSURE

An electronic circuit module comprises a small plate of insulating material, bearing on one side a printed circuit, electronic components packaged and interconnected by means of said printed circuit, and terminals formed by free terminals of said components perpendicularly arranged with respect to said plate for connection to printed circuit boards.

This is a continuation of application Ser. No. 505,147, filed Oct. 25, 1965, now abandoned.

The present invention refers to electronic circuit modules for electronic computers and to a modular assembly including the same.

It is known that electronic computers and generally electronic data processing equipments comprise a very high number of basic circuits, which take a considerable space, affect the operation rate because of the length of their connections and require a hard mounting work.

In order to obviate these disadvantages and to increase the package density of the electronic components, to improve and to shorten the paths of their connections and, finally, to adopt a modular assembly, that is, an assembly obtained by composing electronic circuit modules, generally each one equal to the other, an electronic circuit module has been suggested, comprising a small plate of insulating material, whereon electronic components are packaged and interconnected by means of a first printed circuit borne by one side of said small plate.

However, generally, these electronic circuit modules have the disadvantage of requiring mounting operations which can hardly be made automatic as the terminals of the electronic components normally want complicated bending operations, before being inserted into suitable holes of said small plate in order to be welded to said first printed circuit.

Furthermore, in order that said circuit modules can be interconnected, said small plates must be provided with their own suitable terminals which must be electrically connected and mechanically anchored thereto by means of procedures that complicate both their structure and manufacturing.

These and other disadvantages are obviated by the electronic circuit module according to the invention, which is characterized in that said terminals are formed by free terminals of said components, said free terminals being perpendicularly arranged with respect to said small plate.

It is apparent that this arrangement of the free terminals allows a ready electrical interconnection of the circuit modules so as to build a modular assembly, particularly of the type comprising a plurality of pluggable boards of insulating material, each bearing at least on one side a second printed circuit having fixed thereto a plurality of circuit modules according to the invention. According to a further characteristic of the invention, each one of said pluggable boards is provided with holes wherein said free terminals may be inserted perpendicularly with respect to said board and welded to said second printed circuit.

This and other features of the invention will clearly appear from the following specification of a preferred embodiment thereof, made by way of example and not in a limiting sense with reference to the annexed drawings, wherein.

The basic element of the modular assembly is a circuit module (FIGS. 1 through 4) comprising a small plate 1 of insulating material, bearing on its side 2 or on the opposite side or on both sides a printed circuit obtained according to the known techniques, having fixed thereto electronic elements 3, 4, 5, 6, 7, 8, 10, for instance resistors, capacitors, diodes and transistors. The small plate 1 bearing the printed wiring has the task of supporting and interconnecting the different components of each module. For this reason one or more terminals of said components are inserted into suitable holes of the small plate 1 and connected and anchored by means of soldering to the printed circuit on the side 2.

Figure 4:
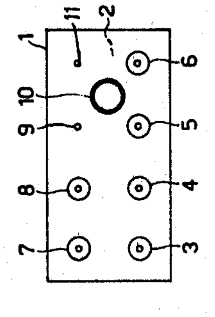
FIG. 4 is a sectional view of an electronic circuit module according to the invention, taken along the line IV—IV in FIG. 1.
Figure 5:
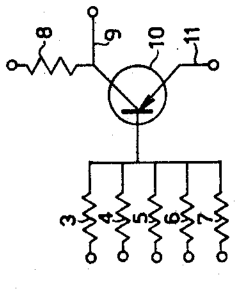
FIG. 5 shows the electrical diagram of an electronic circuit module according to the invention.

In an embodiment each circuit module comprises six resistors 3, 4, 5, 6, 7, 8, one transistor 10 and two leads 9, 11 which are interconnected by means of the circuit printed on the side 2, according to the circuit diagram of FIG. 5, in order to form a so-called resistor-and-transistor NOR circuit. In this case each circuit module is provided with eight terminals which are perpendicular with respect to the small plate 1 and are arranged as indicated in FIG. 4. Due to the above mentioned arrangement, the manufacturing of said circuit modules is suitable to be automatically made by means of a simple machinery.

As it is known, all functions of the binary logic employed in the electronic computers may be performed by the suitable interconnection of NOR circuits equal to the one shown in FIG. 5. It is therefore apparent that an electronic computer may be essentially formed by circuit modules as the one specified, with the addition of some circuit modules having a special circuit structure but whose electronic components may still be mounted in such a way as to form circuit modules that are analogous to the one specified.

The circuit modules are packaged on pluggable boards 12, 13, 14 provided with printed circuits and arranged parallel to each other, and combined and secured in pairs by bolts 15 inserted in separators 16. The terminals of the circuit modules pass the pluggable boards 12, 13, 14, made of an insulating material, through suitable holes 42, 43, 44 and are soldered to a printed circuit bonded on the side 17, 18, 19 of the pluggable board 12, 13, 14 respectively. Said printed circuit is apt to electrically interconnect the plurality of circuit modules borne by each pluggable board. It is apparent that also the mounting of the circuit modules onto the pluggable boards lends itself to being automatically accomplished by a very simple machinery, due to the peculiar sort of the intercomnections.

Figure 1:
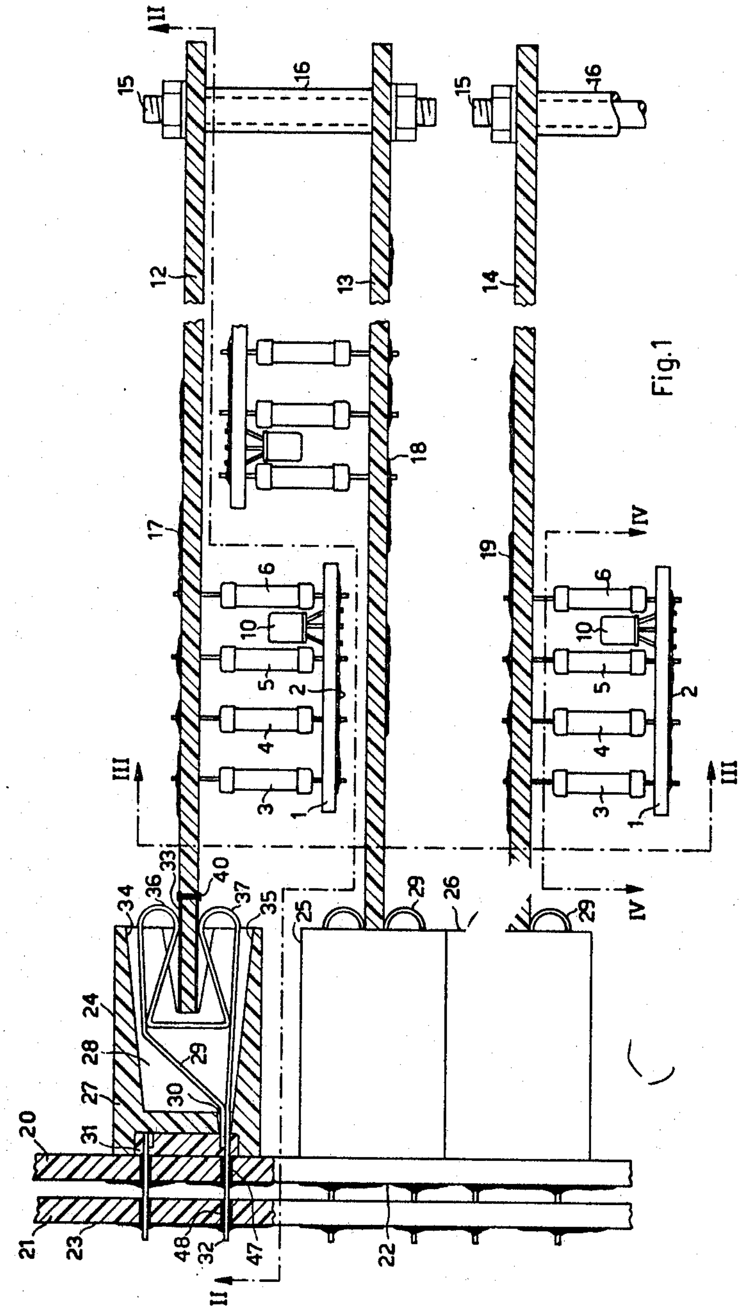
FIG. 1 is a view of the modular assembly, according to the invention.
Figure 2:
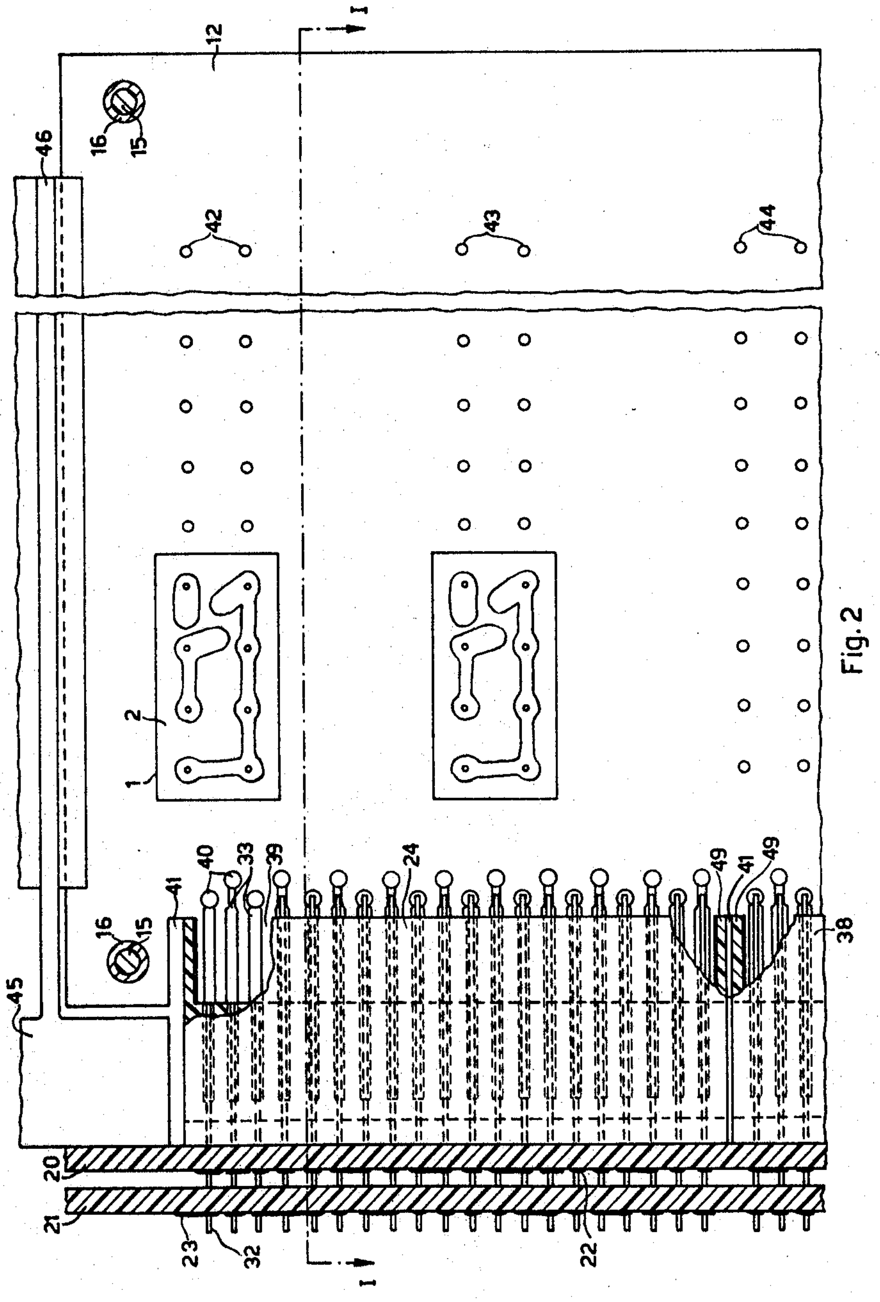
FIG. 2 is a sectional view taken along the line II—II in FIG. 1.
Figure 3:
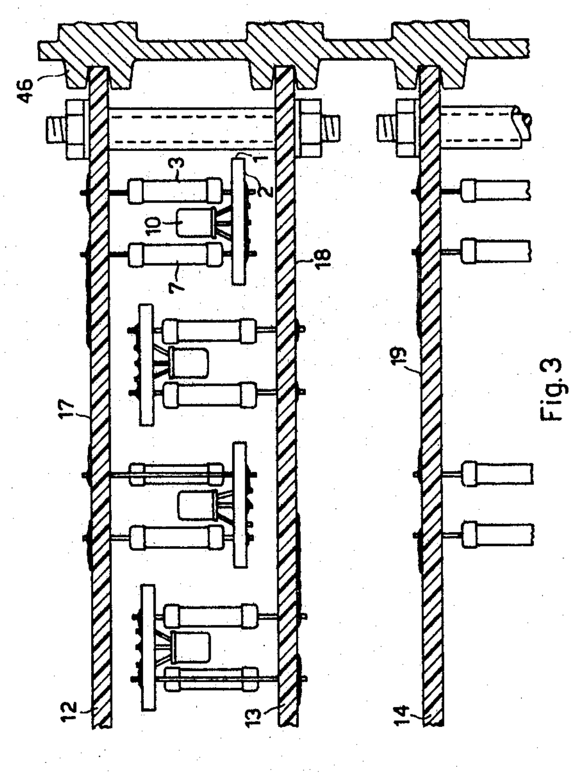
FIG. 3 is a sectional view taken along the line III—III in FIG. 1.

The circuit modules are packaged on the pluggable boards in separated arrays, as shown in FIG. 2, along the series of holes 42, 43, 44; furthermore pairs of pluggable boards as 12 and 13 have said hole series arranged in alternate positions, so that when said two boards are joined together by means of bolts 15, the arrays of circuit modules packaged on one panel become inserted between the arrays of circuit modules packaged on the other pluggable board (FIG. 3). This arrangement allows to achieve a remarkable total density of electronic components, yet using printed circuit having a low density of printed wirings and therefore being of simple features and of low cost.

A suitable frame 45 supports the connecting panels 20, 21 with the pertinent connectors, and is provided with guideways 46 adapted to support and guide the pluggable boards during the plugging and the extracting operations.

It is understood that many changes, addition of parts and improvements may be made to the above described circut module without departing from the scope thereof.

What is claimed is:

1. Modular assembly for electronic circuits, comprising:

(a) at least two parallel pluggable boards of insulating material, each one bearing a first circuit printed thereon, (b) a plurality of small plates of insulating material for each board, the plates of said plurality being arranged in a plane parallel to said board, and facing a contiguous board and each plate bearing at least on one side a second printed circuit, (c) a group of electronic components for each plate, each group of components including components having at least a first terminal fixed to said first printed circuit of the corresponding board and at least a second terminal fixed to said second printed circuit of the last mentioned plate, (d) the plates of said plurality being mechanically and electrically connected to said board solely by means of the last mentioned components, (e) and the plates of one plurality being arranged in the same plane and interleaved with the plates of the other plurality.

2. Modular assembly for electronic circuits, comprising:

(a) a printed-circuit board which has edge terminals for plugging the board into an edge connector;

(b) a plurality of plates of insulating material, each plate being smaller than said printed-circuit board and not provided with edge terminals and bearing at least on one side a printed-circuit, the plates of said plurality being arranged in a plane spaced from and parallel to said printed-circuit board;

(c) a group of electronic components for each plate, each group of components including components having at least a first terminal fixed to the printed-circuit of said board and at least a second terminal fixed to the printed-circuit of said plate;

(d) and the plates of said plurality being mechanically and electrically connected to said printed-circuit board solely by means of the last mentioned components.

References Cited

UNITED STATES PATENTS

| | | | |
|---|---|---|---|
| 2,862,992 | 12/1958 | Franz | 174—52 |
| 3,181,034 | 4/1965 | Kell et al. | 317—100 |
| 3,042,740 | 7/1962 | Bosworth. | |

ROBERT K. SCHAEFER, Primary Examiner

J. R. SCOTT, Assistant Examiner

U.S. Cl. X.R.

339—17; 174—52